United States Patent
Cai et al.

(10) Patent No.: US 12,490,425 B2
(45) Date of Patent: Dec. 2, 2025

(54) WRAP-AROUND MEMORY CIRCUIT

(71) Applicant: GlobalFoundries Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 419 days.

(21) Appl. No.: 17/958,806

(22) Filed: Oct. 3, 2022

(65) Prior Publication Data

US 2024/0114682 A1    Apr. 4, 2024

(51) Int. Cl.
*H01L 21/762*    (2006.01)
*H10B 20/25*     (2023.01)

(52) U.S. Cl.
CPC .................. *H10B 20/25* (2023.02)

(58) Field of Classification Search
CPC .............. H10B 20/25; H01L 21/76224; H10D 30/6731; H10D 30/6745; H10D 86/421; H10D 86/60
See application file for complete search history.

(56) References Cited

U.S. PATENT DOCUMENTS

| | | | |
|---|---|---|---|
| 9,490,007 B1* | 11/2016 | Chan | G11C 8/16 |
| 9,659,943 B1* | 5/2017 | Tran | H10D 30/696 |
| 9,852,982 B1 | 12/2017 | Pei et al. | |
| 9,935,113 B2 | 4/2018 | Wu et al. | |
| 2004/0238919 A1 | 12/2004 | Brintzinger et al. | |
| 2007/0257331 A1 | 11/2007 | Kurjanowicz et al. | |
| 2018/0315839 A1* | 11/2018 | Zhou | H10D 30/024 |
| 2021/0280577 A1* | 9/2021 | Chen | H10D 84/856 |

* cited by examiner

*Primary Examiner* — Samuel Park
(74) *Attorney, Agent, or Firm* — Andrew M. Calderon; Calderon Safran & Wright P.C.

(57) ABSTRACT

The present disclosure relates to a structure which includes a semiconductor substrate, a recessed shallow trench isolation structure within the semiconductor substrate, and a gate structure provided at least partially over the recessed shallow isolation structure.

19 Claims, 8 Drawing Sheets

WRAP-AROUND MEMORY CIRCUIT

BACKGROUND

The present disclosure relates to semiconductor structures and, more particularly, to a polysilicon wrap-around memory circuit and methods of manufacture and operation.

A one-time-programmable (OTP) memory is a charge trap transistor based non-volatile memory which contains a twin cell circuit. In the twin cell circuit, data is stored when electrons are trapped in a gate dielectric. The trapped electrons (i.e., trapped charge) lead to a threshold voltage (Vt) shift on either the true transistor or complement transistor, which weakens the device.

In OTP memory circuits, a bitcell size may be quite large and may not have an optimized program efficiency. Conventional OTP memory circuits may address the bitcell size issue and program inefficiency by having different oxide thicknesses, a shallow trench isolation (STI) intensive array structure, or a fin field effect transistor (finfet) based OTP with a wrap-around between a metal gate and an active (i.e., Rx) fin structure.

SUMMARY

In an aspect of the disclosure, a structure includes: a semiconductor substrate, a recessed shallow trench isolation structure within the semiconductor substrate, and a gate structure provided at least partially over the recessed shallow isolation structure.

In an aspect of the disclosure, a structure includes: diffusion regions within a well region of a semiconductor substrate; a shallow trench isolation (STI) structure between the diffusion regions; and a gate structure over the STI structure and which overlaps with the diffusion regions.

In an aspect of the disclosure, a method includes: forming a recessed shallow trench isolation structure within a semiconductor substrate; and forming a gate structure provided at least partially over the recessed shallow isolation structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a polysilicon wrap-around memory circuit and methods of manufacture and operation. The polysilicon wrap-around memory circuit comprises a polysilicon wrap-around shallow trench isolation (STI) one-time-programmable (OTP) structure. For example, in embodiments, a polysilicon transistor may include a wrap-around semiconductor (i.e., Si) corner used as the OTP structure. In further embodiments, polysilicon may be provided around all of the Rx (i.e., active)/STI boundary structures. Advantageously, in comparison to known circuits, the polysilicon wrap-around memory circuit saves area (i.e., is more compact) and has a higher read current with a wrap-around in all directions.

The polysilicon wrap-around memory circuit of the present disclosure may be manufactured in several ways using a number of different tools. In general, though, the methodologies and tools are used to form structures with dimensions in the micrometer and nanometer scale. The methodologies, i.e., technologies, employed to manufacture the polysilicon wrap-around memory circuit of the present disclosure have been adopted from integrated circuit (IC) technology. For example, the structures are built on wafers and are realized in films of material patterned by photolithographic processes on the top of a wafer. In particular, the fabrication of the polysilicon wrap-around memory circuit uses three basic building blocks: (i) deposition of thin films of material on a substrate, (ii) applying a patterned mask on top of the films by photolithographic imaging, and (iii) etching the films selectively to the mask.

Figure 1:
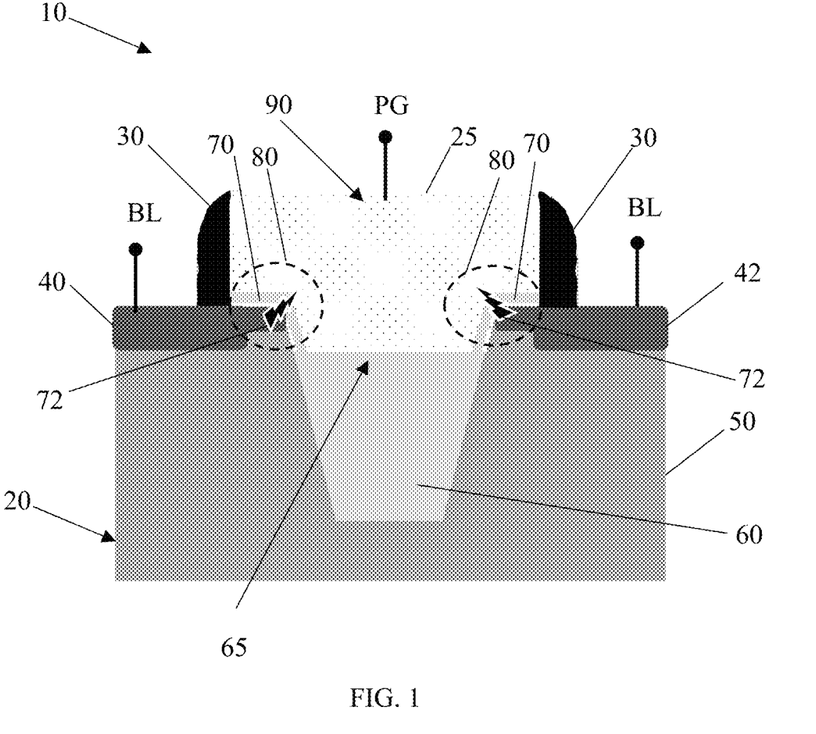
FIG. 1 shows a polysilicon transistor structure with a wrap-around corner used as a one-time programmable (OTP) memory circuit in accordance with aspects of the present disclosure.

FIG. 1 shows a transistor structure with a wrap-around semiconductor corner used as a one-time programmable (OTP) memory circuit. The memory circuit structure 10 is compact (i.e., less area in twin bits per cell) in comparison to known circuits and has an increased program (PGM) efficiency by a PGM and low power requirements. Moreover, the memory circuit structure 10 has a tighter post-PGM current read (i.e., Iread) distribution due to a confined breakdown path than known circuits. In addition, the memory circuit structure 10 is simple to implement through a divot or STI recess process.

More specifically and referring to FIG. 1, the memory circuit structure 10 includes a gate structure 90 formed partially within a recess 65 of a shallow trench isolation structure (STI) 60. More specifically, the gate structure 90 may be provided partially over a well region 50 in semiconductor material 20 and within a recess 65 of the STI structure 60. In this way, the gate structure 90 may have semiconductor material of the semiconductor substrate 20 wrap around a corner 80 (i.e., wraparound Si corner) of the gate structure 90. A gate dielectric oxide (i.e., GOX before a polysilicon deposition) may also isolate the gate structure 90 from a drain region 40, 42. The drain region 40, 42 is a complete drain region of two bit cells. In particular, the memory circuit structure 10 includes two bit cells in which the gate 90 is shared and the drain region 40 is separated from the drain region 42 for the 2 bit cells within the well 50, e.g., p-well. The drain region 40, 42 may lower resistance of the memory circuit structure 10 in comparison to known circuits.

The gate structure 90 comprises polysilicon material 25 over a gate dielectric material 70. Sidewall spacers 30, e.g., SiN, may be provided on the gate structure 90. The drain region 40, 42 may be provided adjacent to the gate structure 90 within the p-well region 50. The drain region 40, 42 may comprise N-type dopants within the p-well 50 of the semiconductor material 20; although other embodiments may include the drain region 40, 42 being a P-type semiconductor material and the well region 50 being a N-type semiconductor material. Bitline (BL) contacts are provided in contact with the drain region 40, 42. A gate contact (PG) is provided to the gate structure 90.

In embodiments, the semiconductor material 20 may be a fully depleted semiconductor-on-insulator (FDSOI) substrate. In embodiments, the semiconductor substrate 20 may be composed of any suitable semiconductor material including, but not limited to, Si, SiGe, SiGeC, SiC, GaAs, InAs, InP, and other III/V or II/VI compound semiconductors. Accordingly, as the gate structure 90 is within the recess 65 of the STI structure 60, material of the semiconductor substrate 20 may wraparound corners 80 of gate structure 90 resulting in transistor with a wrap-around structure of semiconductor material (i.e., Si or other semiconductor material forms a wrap-around corner 80).

During an operation, a voltage applied to the memory circuit structure 10 may cause a larger electric field as depicted at reference numeral 72 to be generated in the corner 80 (i.e., Si) in comparison to known circuits. By generating the larger electric field 72 in the memory circuit structure 10, a read current will increase and the power of the memory circuit structure 10 will also increase.

Figure 2A:
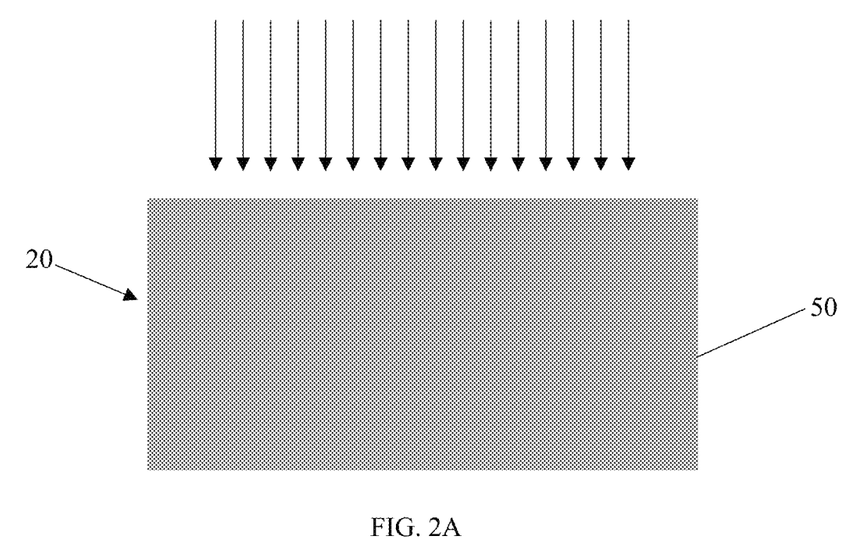
FIGS. 2A-2F show fabrication processes of the polysilicon transistor structure with a wrap-around corner of FIG. 1 in accordance with aspects of the present disclosure.

FIGS. 2A-2F show respective fabrication processes of the structure 10 of FIG. 1, e.g., a polysilicon transistor structure with a wrap-around silicon corner used as a one-time programmable (OTP) memory circuit. In FIG. 2A, a well region 50 of a memory circuit structure 10 may be formed in the semiconductor substrate 20 by conventional ion implantation processes. For example, the well region 50 may be formed by introducing a concentration of a p-type dopant species in the semiconductor substrate 20 as represented by the arrows.

In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The well region 50 may be doped with p-type dopants, e.g., Boron (B), among other suitable examples. In alternative embodiments and depending on the type of device, the well region 50 may be doped with n-type dopants, e.g., Arsenic (As), Phosphorus (P) and Sb, among other suitable examples.

Figure 2B:
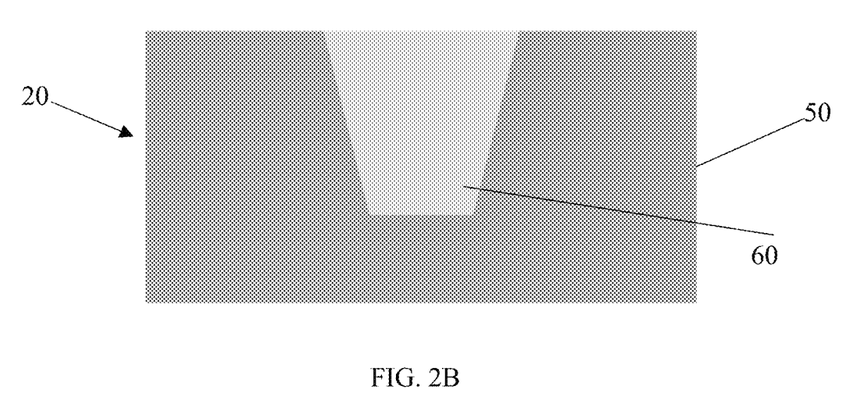

In FIG. 2B, the STI structure 60 may be formed within the well region 50. The STI structure 60 may be formed by conventional lithography, etching and deposition methods known to those of skill in the art. For example, a resist formed over the well region 50 is exposed to energy (light) to form a pattern (opening). An etching process with a selective chemistry, e.g., reactive ion etching (RIE), will be used to transfer the pattern from the resist layer to the well region 50 to form one or more trenches through the openings of the resist. Following resist removal by a conventional oxygen ashing process or other known stripants, insulator material, e.g., $SiO_2$, may be deposited in the trench by any conventional deposition processes, e.g., chemical vapor deposition (CVD) processes. Any residual material on the surface of the well region 50 may be removed by conventional chemical mechanical polishing (CMP) processes.

Figure 2C:
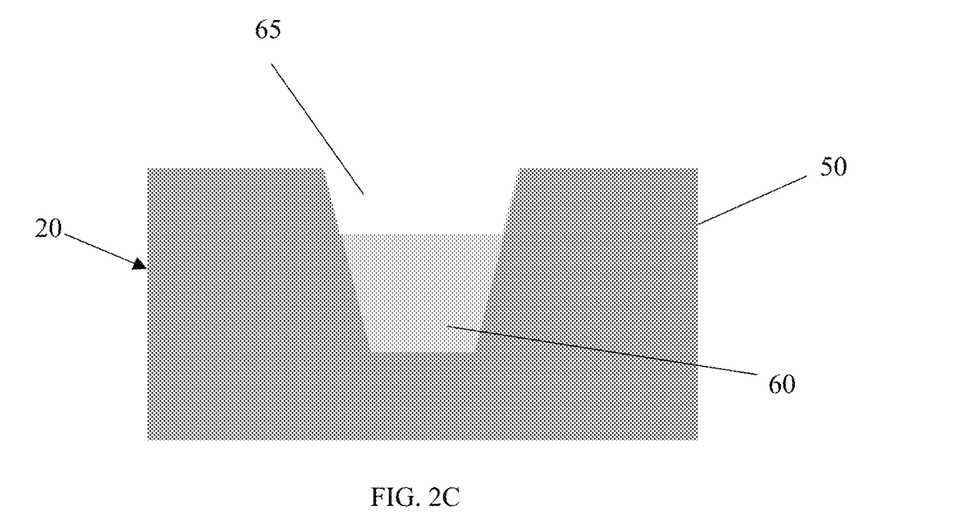

In FIG. 2C, the insulator material of the STI structure 60, e.g., $SiO_2$, may be recessed to below a surface of the semiconductor substrate 20 as depicted by reference numeral 65. In embodiments, the recess 65 may be provided by a timed-etch with a chemistry selective to the material of the STI structure 60, e.g., $SiO_2$. In alternative embodiments, this recess 65 may be formed by the deposition of the insulator material of the STI structure 60 at a lower height profile.

Figure 2D:
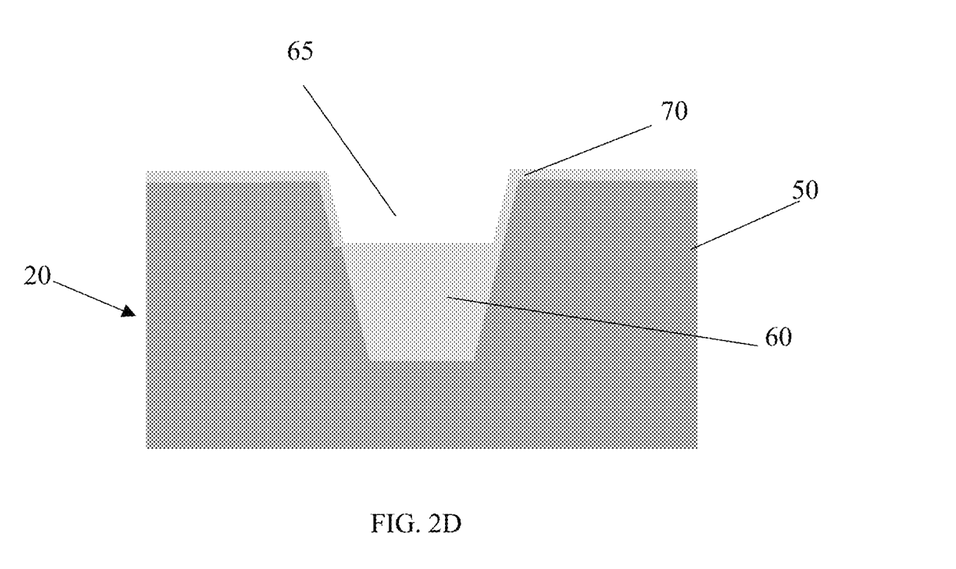

In FIG. 2D, a gate dielectric material 70 may be deposited over the semiconductor substrate 20, e.g., top surfaces of the well region 50, and within the recess 65 of the STI structure 60. In embodiments, the gate dielectric material 70 may be deposited by a blanket deposition process, e.g., CVD. The recess 65 will remain after the deposition of the gate dielectric material 70 in order to ensure that the gate structure lies below the upper surface of the semiconductor substrate 20. The gate dielectric material 70 may be a high-k or low-k material known to those of skill in the art such that no further explanation is required for a complete understanding of the present disclosure.

Figure 2E:
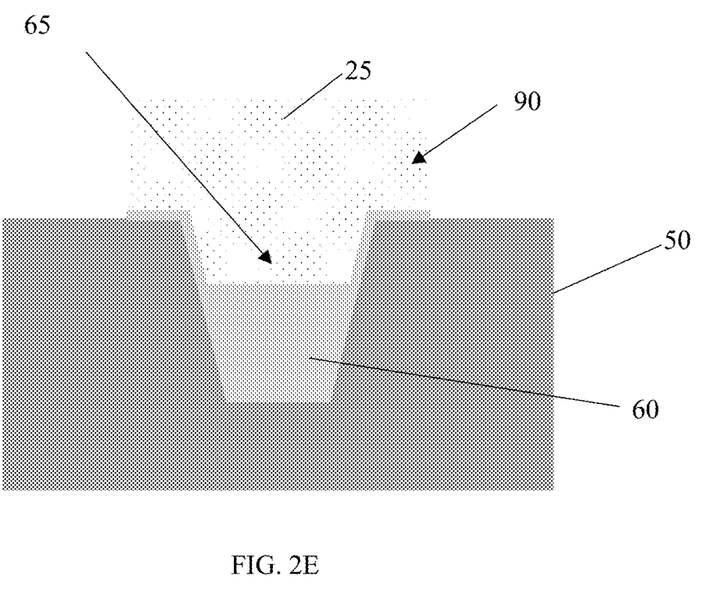

In FIG. 2E, a gate material 25 may be formed over the gate dielectric material 70 and within the recess 65 on the STI structure 60 and on sides of the STI structure 60. For example, the gate material 25 may be formed by the deposition of polysilicon material within the recess 65 on the STI structure 60 and over the gate dielectric material 70 on sides of the STI structure 60. The deposition process may be, e.g., CVD or atomic layer deposition (ALD) or plasma enhanced CVD (PECVD). Following the deposition of the gate material 25, the gate dielectric material 70 and the gate material 25 may be patterned by conventional patterning processes (e.g., lithography and etching) as is known in the art to form the gate structure 90. In this way, the gate structure 90 will be surrounded by the semiconductor material 20 thereby, e.g., having a wrap-around semiconductor (e.g., Si) corner 80 (as shown in FIG. 1).

Figure 2F:
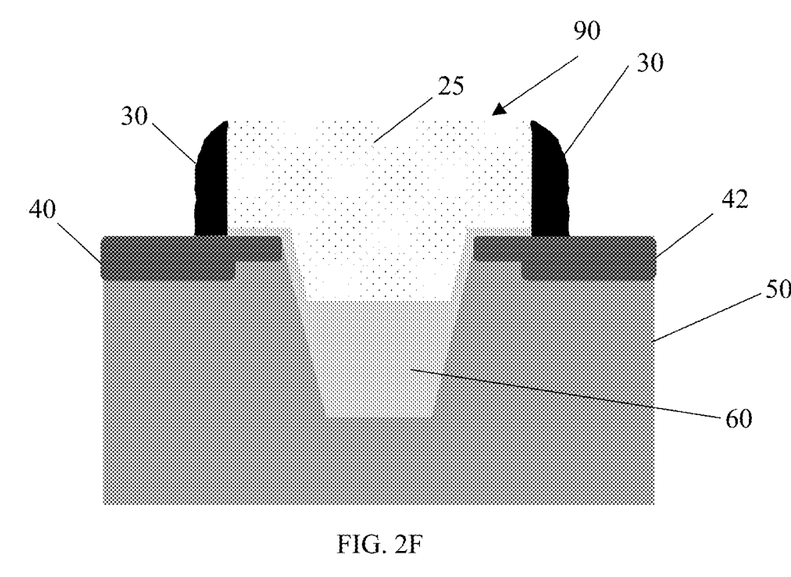

In FIG. 2F, sidewall spacers 30 may be formed on the gate structure 90. The sidewall spacers 30 may be an oxide and/or a nitride, blanket deposited on the structure followed by an anisotropic etching process to form sidewall spacers 30. Prior to the etching process, the drain region 40, 42 may be formed by conventional ion implantation processes. For example, the drain region 40, 42 may be formed by introducing a concentration of dopant in the semiconductor material 20. The drain region 40, 42 may include n-type dopants, e.g., Arsenic (As), Phosphorus (P), and Sb, among other suitable examples.

Conventional back of the line processes can be performed to form the back end of the line wiring structures, e.g., silicide, bitline contact (BL) and gate contact (PG). For example, as should be understood by those of skill in the art, the silicide process begins with deposition of a thin transition metal layer, e.g., nickel, cobalt or titanium, over fully formed and patterned semiconductor devices (e.g., doped or ion implanted drain region 40, 42, and respective devices 90). After deposition of the material, the structure is heated allowing the transition metal to react with exposed silicon (or other semiconductor material as described herein) in the active regions of the semiconductor device (e.g., drain, gate contact region) forming a low-resistance transition metal silicide. Following the reaction, any remaining transition metal is removed by chemical etching, leaving silicide contacts in the active regions of the device. The contacts and wiring structures (e.g., BL and PG contacts) may be formed by conventional deposition, lithography and etching processes as is known in the art such that no further explanation is required for a complete understanding of the present disclosure.

Figure 3A:
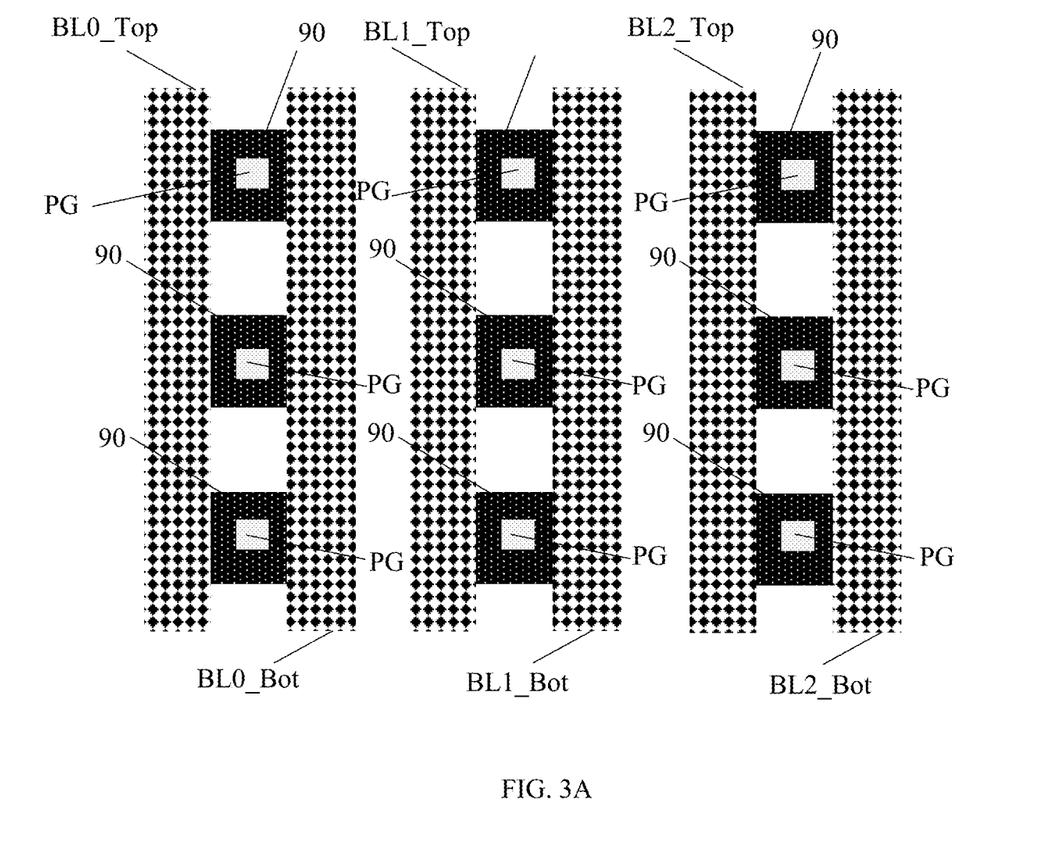
FIG. 3A shows a polysilicon transistor structure with a wrap-around corner used as a one-time programmable (OTP) memory circuit in accordance with additional aspects of the present disclosure.

FIG. 3A shows a layout of the memory circuit structure 10. The layout includes the gate structure 90, the gate contract (PG), and bitlines BL0_Top, BL0_Bot, BL1_Top, BL1_Bot, and BL2_Top, and BL2_Bot. The gate structure 90 may be between the bitlines BL0_Top and BL0_Bot. Further, the gate structure 90 may be between the bitlines BL1_Top and BL1_Bot. The gate structure 90 may also be between the bitlines BL2_Top and BL2_Bot. The gate contract (PG) may be at the center of each of the gate structures 90.

Figure 3B:
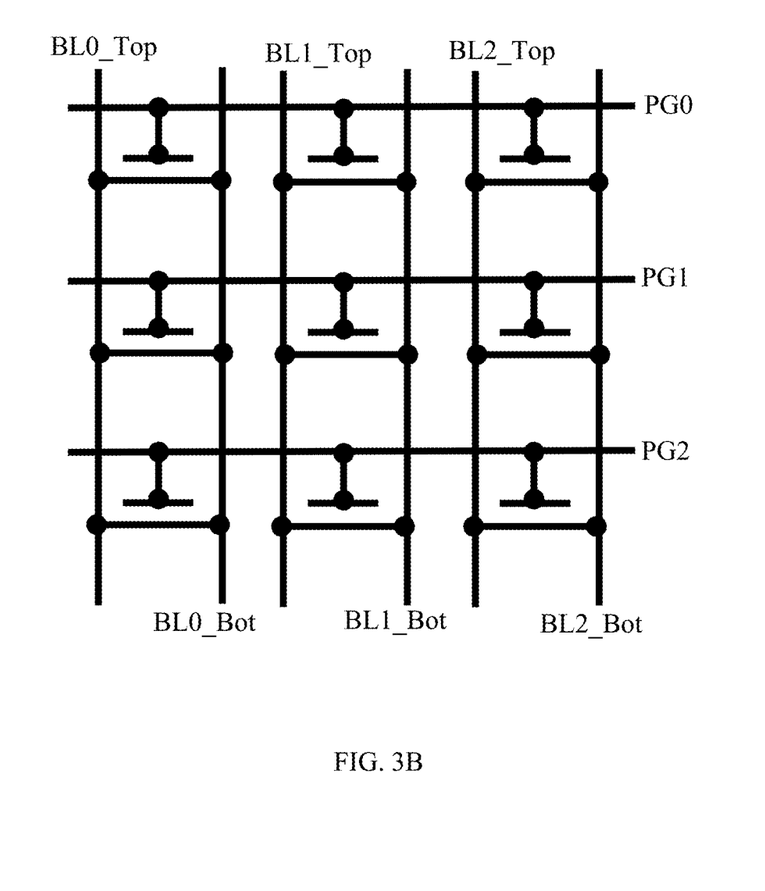
FIG. 3B shows a schematic structure of the memory circuit structure of FIG. 3A.

FIG. 3B shows a schematic structure of the memory circuit structure. The schematic structure includes bitlines BL0_Top, BL0_Bot, BL1_Top, BL1_Bot, and BL2_Top, and BL2_Bot and gate (PG) contacts PG0, PG1, and PG2. In particular, each of the PG contacts PG0, PG1, and PG2 directly contact the gate structure of a transistor (similar to the PG contact in FIG. 3A which directly contacts the gate structure 90). In FIG. 3B, the bitlines BL0_Top, BL0_Bot, BL1_Top, BL1_Bot, and BL2_Top, and BL2_Bot are in a similar configuration relative to the PG contacts PG0, PG1, and PG2 as FIG. 3A.

In operation, during a read operation, if the gate structure 90 and the bitline BL are selected (i.e., sel), the applied voltage is 0 volts at the gate structure 90 the bitline BL has a VDD voltage value, and the well region 50 has a zero value. During the read operation, if the gate structure and the bitline BL are un-selected (i.e., un-sel), the gate structure 90 is floated, the bitline BL is floated, and the well region 50 has a zero value.

Table 1 below shows bias conditions, values of the gate structures (PG), values of the bitlines BL, and values of the p-well region 50 during operation.

TABLE 1

| Bias condition | PG | | BL | | Well |
| --- | --- | --- | --- | --- | --- |
| | Sel | Un-Sel | Sel | Un-Sel | |
| Program | +$V_{PGM}$ | $V_{inh}$ | 0 | $V_{inh}$ | 0 |
| Read | 0 | Float | VDD | Float | 0 |

In particular, during a program operation, if the gate structure 90 and the bitline BL are selected (i.e., sel), the applied voltage is +Vpgm at the gate structure 90, the bitline BL has a zero value, and the well region 50 has a zero value. During the program operation, if the gate structure 90 and the bitline BL are un-selected (i.e., un-sel), the applied voltage is Vinh (i.e., an inhibit voltage which is slightly smaller than or equal to the Vpgm) at the gate structure 90, the bitline BL also receives the applied voltage Vinh, and the well region 50 has a zero value.

Figure 4A:
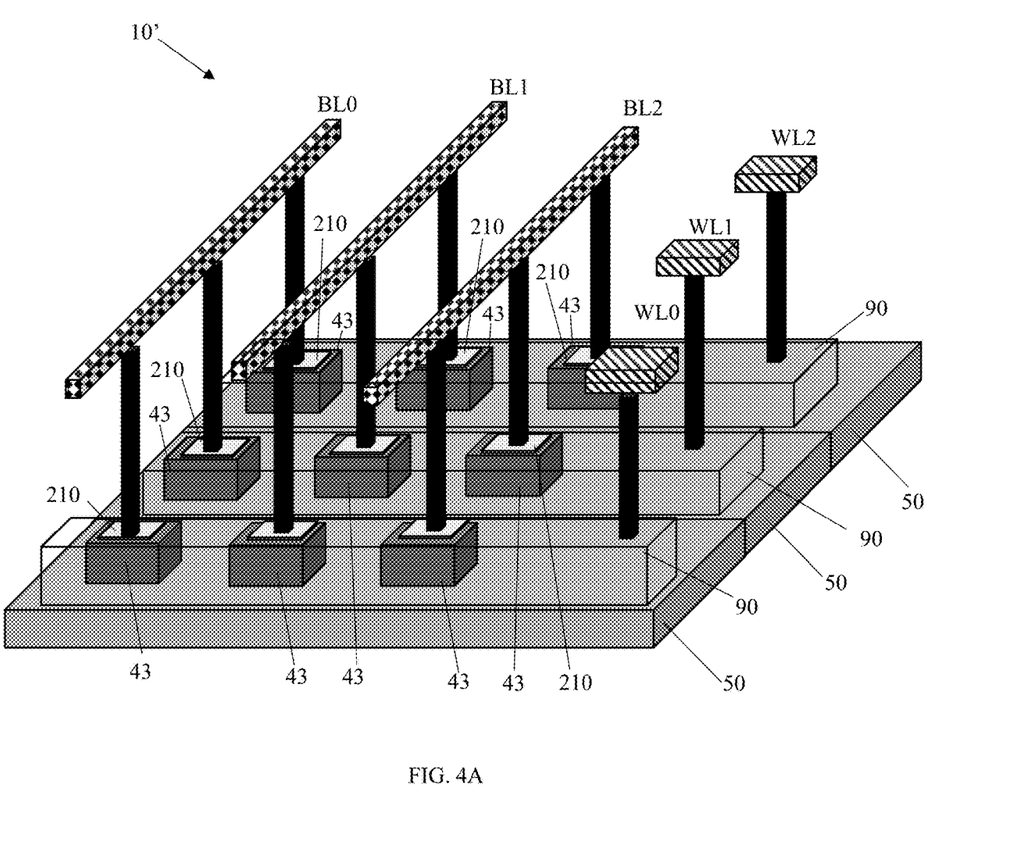
FIGS. 4A-4B show a polysilicon wrap-around structure in all directions in accordance with aspects of the present disclosure.
Figure 4B:
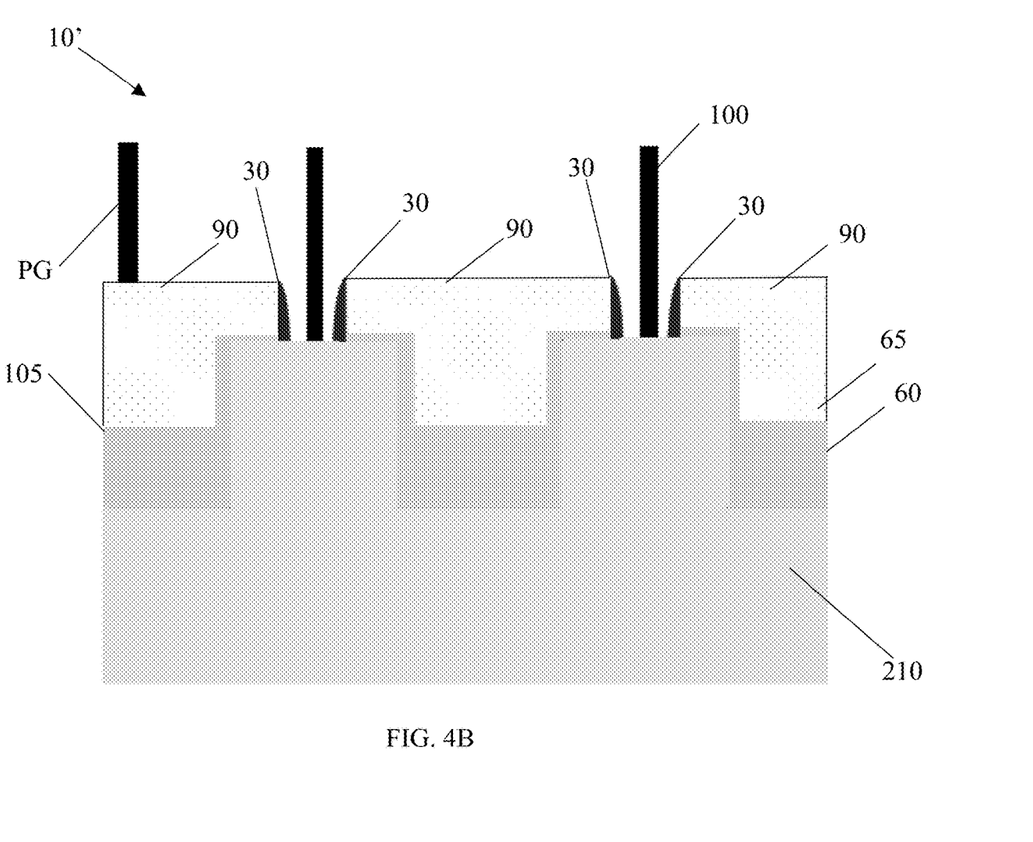

FIGS. 4A-4B show a polysilicon wrap-around structure in all directions in accordance with additional aspects of the present disclosure. FIG. 4B shows a cross-section of the memory circuit structure 10' of FIG. 4A. In FIGS. 4A and 4B, the memory circuit structure 10' includes gate structures 90, doped regions 43, well regions 50, active regions 210 (i.e., Rx), bitlines BL0, BL1, BL2, and wordlines WL0, WL1, WL2. The doped regions 43 may comprise a drain region. In embodiments, each of the doped regions 43 may be N-type doped regions 43 and each of the well regions 50 may be p-well regions.

In FIG. 4A, each of the bitlines BL0, BL1, and BL2 may be connected to the active (i.e., Rx) regions 210. In FIG. 4A, each of the wordlines WL0, WL1, WL2 may be connected to the gate structures 90. A polysilicon wrap-around 105 is provided in all directions for efficient program (PGM) operations. For example, the polysilicon wrap-around 105 occurs in all directions of a periphery boundary between the gate structure 90 and the active regions (i.e., Rx) 210. As shown in FIG. 4B, the polysilicon wrap-around 105 is provided in the entire boundary between the gate structure 90 and the active (i.e., Rx) regions 210 instead of just the wraparound corner 80 as shown in FIG. 1. In this way, the memory circuit structure 10' has a higher read current than the memory circuit structure 10 of FIG. 1 after a program (PGM) operation is performed due to an increased perimeter of a read path.

FIG. 4B shows a cross-section of the memory circuit structure 10' of FIG. 4A. In FIG. 4B, the STI structure 60 may be provided over the active (i.e., Rx) region 210. As shown, the gate structure 90 may be provided within the recesses 65 of the STI structure and extending over the active region (i.e., Rx) 210. The sidewall spacers 30 may be provided on sidewalls of the gate structures 90. The STI structure 60 may isolate the gate structure 90 from the active (i.e., Rx) region 210. Contacts 100 are provided to the active region (i.e., Rx) 210 between the sidewall spacers 30. The gate contacts (PG) are also provided to the gate structure 90.

During an operation of the memory circuit structure 10' in FIGS. 4A and 4B, a voltage being applied to the memory circuit structure 10' may generate a same amount of electric field as the electric field 72 of the memory circuit structure 10 of FIG. 1. By applying a higher voltage bias to the memory circuit structure 10', a read current will increase due to a larger size of a periphery boundary between the gate structure 90 and the active region 210 (i.e., Rx) than the memory circuit structure 10 of FIG. 1.

Table 2 shows bias conditions, values of the gate structures 90, values of the bitlines BL, and values of the well region 50 of the memory structure of FIGS. 4A and 4B.

TABLE 2

| Bias condition | PG | | BL | | Well |
| --- | --- | --- | --- | --- | --- |
| | Sel | un-sel | Sel | un-sel | |
| Program | +$V_{PGM}$ | $V_{inh}$ | 0 | $V_{inh}$ | 0 |
| Read | 0 | Float | VDD | Float | 0 |

In particular, during a program operation, if the gate structure 20 and the bitline BL are selected (i.e., sel), the applied voltage is +Vpgm (the memory circuit structure 10' has a higher programming voltage +Vpgm in Table 2 than a programming voltage +Vpgm of the memory circuit structure 10) at the gate structure 20, the bitline BL has a zero value, and the well region 50 has a zero value. During the program operation, if the gate structure and the bitline BL are un-selected (i.e., un-sel), the applied voltage is Vinh (i.e., an inhibit voltage which is smaller than the Vpgm) at the gate structure 20, the bitline BL also receives the applied voltage Vinh, and the well region 50 has a zero value.

During a read operation, if the gate structure 20 and the bitline BL are selected (i.e., sel), the applied voltage is 0 volts at the gate structure 20, the bitline BL has a VDD voltage value, and the well region 50 has a zero value. During the read operation, if the gate structure and the bitline BL are un-selected (i.e., un-sel), the gate structure 20 is floated, the bitline BL is floated, and the well region 50 has a zero value.

The polysilicon wrap-around memory circuit may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a semiconductor substrate;
   a recessed shallow trench isolation structure within the semiconductor substrate;
   a gate structure provided at least partially over the recessed shallow isolation structure, and which is recessed below an upper surface of the semiconductor material; and
   a wrap-around material at a boundary between the gate structure and active regions, the wrap-around material being in all directions of the boundary between the gate structure and the active regions, and the wrap-around material surrounding the active regions.

2. The structure of claim 1, wherein the gate structure is further provided over a well region of the semiconductor substrate.

3. The structure of claim 2, wherein the gate structure is isolated from the well region by a gate dielectric oxide.

4. The structure of claim 2, wherein the well region is a p-well in the semiconductor substrate.

5. The structure of claim 4, wherein the semiconductor substrate comprises fully depleted semiconductor on insulator material (FDSOI).

6. The structure of claim 1, wherein the semiconductor material surrounds the gate structure.

7. The structure of claim 6, wherein corners of the gate structure are surrounded by the semiconductor material.

8. The structure of claim 6, wherein the gate structure comprises polysilicon material.

9. The structure of claim 1, wherein the wrap-around material comprises polysilicon material.

10. The structure of claim 1, wherein the gate structure is isolated from a drain region by insulator material wrapping around corners of the gate structure.

11. The structure of claim 1, further comprising:
    a second recessed shallow trench isolation structure within the semiconductor substrate; and
    a second gate structure provided at least partially over the second recessed shallow trench isolation structure.

12. The structure of claim 11, wherein:
    a portion of the semiconductor substrate extends above an upper surface of the recessed shallow trench isolation structure and an upper surface of the second recessed shallow trench isolation structure;
    the wrap-around material is provided around the portion of the semiconductor substrate extending above shallow trench isolation structure and the second recessed shallow trench isolation structure to surround the active regions; and
    the wrap-around material is above and surrounding the active regions and at least partially under a portion of the gate structure and the second gate structure that extends over an upper surface of the portion of the semiconductor substrate adjacent to the recessed shallow trench isolation structure and the second recessed shallow trench isolation structure.

13. A structure comprising:
    diffusion regions within a well region of a semiconductor substrate; and
    a shallow trench isolation (STI) structure between the diffusion regions;
    a gate structure over the STI structure and which overlaps with the diffusion regions, wherein the STI structure has a recessed upper surface and the gate structure is at least partially within the recessed upper surface; and
    a wrap-around material at a boundary between the gate structure and active regions, the wrap-around material being in all directions of the boundary between the gate structure and the active regions, and the wrap-around material surrounding the active regions.

14. The structure of claim 13, wherein the gate structure is isolated from the diffusion regions.

15. The structure of claim 13, wherein corners of the gate structure are surrounded by the semiconductor material.

16. The structure of claim 13, wherein the gate structure is isolated from the diffusion regions by insulator material wrapping around corners of the diffusion regions.

17. The structure of claim 13, further comprising:
    a second shallow trench isolation (STI) structure adjacent to the diffusion regions; and
    a second gate structure over the second STI structure and overlapping with the diffusion regions, wherein the second STI structure has a recessed upper surface and the second gate structure is at least partially over the recessed upper surface.

18. The structure of claim 17, wherein:
    above an upper surface of the STI structure and an upper surface of the second STI structure;
    the wrap-around material is provided around the portion of the semiconductor substrate extending above STI structure and the second STI structure to surround the diffusion regions; and
    the wrap-around material is above the diffusion regions and at least partially under a portion of the gate structure and the second gate structure that extends over an upper surface of the portion of the semiconductor substrate adjacent to the STI structure and the second STI structure.

19. A method comprising:

forming a recessed shallow trench isolation structure within a semiconductor substrate;

forming a gate structure provided at least partially over the recessed shallow isolation structure, and which is recessed below an upper surface of the semiconductor material; and forming a wrap-around material at a boundary between the gate structure and active regions, the wrap-around material being in all directions of the boundary between the gate structure and the active regions, and wherein the wrap-around material surrounding the active regions.

* * * * *